(12) United States Patent
Shin et al.

(10) Patent No.: US 11,887,534 B2
(45) Date of Patent: Jan. 30, 2024

(54) DISPLAY APPARATUS

(71) Applicant: Samsung Display Co., Ltd., Yongin-Si (KR)

(72) Inventors: Donghee Shin, Yongin-si (KR); Donghyeon Ki, Yongin-si (KR); Sunkwun Son, Yongin-si (KR); Nahyeon Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/314,941

(22) Filed: May 7, 2021

(65) Prior Publication Data

US 2022/0130328 A1    Apr. 28, 2022

(30) Foreign Application Priority Data

Oct. 23, 2020    (KR) ........................ 10-2020-0138592

(51) Int. Cl.
| | |
|---|---|
| G09G 3/36 | (2006.01) |
| G02F 1/1362 | (2006.01) |
| G09G 3/20 | (2006.01) |
| H01L 27/12 | (2006.01) |
| G11C 19/28 | (2006.01) |
| G09G 3/3225 | (2016.01) |

(52) U.S. Cl.
CPC .......... *G09G 3/3225* (2013.01); *G11C 19/28* (2013.01); *G09G 2300/0443* (2013.01); *G09G 2310/0286* (2013.01)

(58) Field of Classification Search
CPC ......... G09G 3/3225; G09G 2300/0443; G09G 2310/0286; G09G 3/3674–3677; G11C 19/28; G02F 1/13624–136286
See application file for complete search history.

(56) References Cited

U.S. PATENT DOCUMENTS 5,701,166 A  * 12/1997  Fedorovish ......... G02F 1/13624
                                                         349/38
9,082,362 B2    7/2015  Bae et al.
(Continued)

FOREIGN PATENT DOCUMENTS

| CN | 106898324 A | * | 6/2017 | ........... G09G 3/3674 |
| CN | 110379390 A | * | 10/2019 | ........... G09G 3/3607 |

(Continued)

*Primary Examiner* — Lin Li
(74) *Attorney, Agent, or Firm* — Innovation Counsel LLP

(57) ABSTRACT

Provided is a display apparatus in which an area of a dead space is significantly reduced, the display apparatus including a first scan line extending in a first direction, a second scan line spaced apart from the first scan line and extending in the first direction, a first pixel set disposed between the first scan line and the second scan line, the first pixel set including a 1-$1^{st}$ pixel including n sub-pixels and a 1-$2^{nd}$ pixel including n sub-pixels, and n first data lines spaced apart from each other, disposed between the 1-1st pixel and the 1-2nd pixel in a plan view, extending in a second direction crossing the first direction, and electrically connected to the 1-$1^{st}$ pixel and the 1-$2^{nd}$ pixel.

15 Claims, 10 Drawing Sheets

(56) References Cited

U.S. PATENT DOCUMENTS

| | | | |
|---|---|---|---|
| 9,704,429 B2 | 7/2017 | Seo et al. | |
| 2002/0180670 A1* | 12/2002 | Kim | G09G 3/3216 345/76 |
| 2012/0026136 A1* | 2/2012 | Zhang | G09G 3/3614 345/204 |
| 2013/0241814 A1* | 9/2013 | Hirabayashi | G06F 3/0412 345/100 |
| 2014/0054624 A1* | 2/2014 | Chen | G09G 3/20 257/89 |
| 2014/0078032 A1* | 3/2014 | Xia | G02F 1/136286 345/92 |
| 2014/0152640 A1* | 6/2014 | Chen | G09G 3/3607 345/212 |
| 2016/0343731 A1 | 11/2016 | Lee et al. | |
| 2017/0069271 A1* | 3/2017 | Kim | H01L 27/124 |
| 2017/0193876 A1* | 7/2017 | Choi | G09G 3/2003 |
| 2018/0012554 A1* | 1/2018 | Chen | G02F 1/136286 |
| 2018/0331125 A1* | 11/2018 | Wang | H01L 27/124 |
| 2020/0403051 A1 | 12/2020 | Han et al. | |
| 2021/0295761 A1* | 9/2021 | Wu | G02F 1/1362 |

FOREIGN PATENT DOCUMENTS

| | | |
|---|---|---|
| KR | 10-2016-0087020 A | 7/2016 |
| KR | 10-1778650 B1 | 9/2017 |
| KR | 10-1878189 B1 | 7/2018 |

\* cited by examiner

DISPLAY APPARATUS

CROSS-REFERENCE TO RELATED APPLICATION

This application is based on and claims priority under 35 U.S.C. § 119 to Korean Patent Application No. 10-2020-0138592, filed on Oct. 23, 2020, in the Korean Intellectual Property Office, the disclosure of which is incorporated by reference herein in its entirety.

BACKGROUND

1. Field

One or more embodiments relate to a display apparatus, and more particularly, to a display apparatus in which dead space is significantly reduced.

2. Description of the Related Art

In general, a display apparatus includes a scan driver including a shift register for supplying scan signals to sub-pixels in a display area, and a data driver for supplying data signals to sub-pixels in the display area. The scan driver and the data driver are arranged outside of the display area.

SUMMARY

Display apparatuses of the related art have a problem in that a dead space, which is a non-emission area, is large because a scan driver and a data driver are arranged outside a display area.

One or more embodiments provide a display apparatus in which an area of a dead space is significantly reduced. However, this is just an example, and the scope of the disclosure is not limited thereby.

Additional aspects will be set forth in part in the description which follows and, in part, will be apparent from the description, or may be learned by practice of the presented embodiments.

According to one or more embodiments, a display apparatus includes a first scan line extending in a first direction, a second scan line spaced apart from the first scan line and extending in the first direction, a first pixel set disposed between the first scan line and the second scan line, the first pixel set including a $1\text{-}1^{nd}$ pixel including n sub-pixels and a $1\text{-}2^{nd}$ pixel including n sub-pixels, and n first data lines spaced apart from each other, disposed between the 1-1st pixel and the $1\text{-}2^{nd}$ pixel in a plan view, extending in a second direction crossing the first direction and electrically connected to the $1\text{-}1^{nd}$ pixel and the $1\text{-}2^{nd}$ pixel.

In this case, n may be an integer of 3 or more.

The display apparatus may further include a second pixel set disposed between the first scan line and the second scan line, the second pixel set including a $2\text{-}1^{st}$ pixel including n sub-pixels, and a $2\text{-}2^{nd}$ pixel including n sub-pixels, and n second data lines spaced apart from each other, disposed between the 2-1st pixel and the $2\text{-}2^{nd}$ pixel in a plan view, extending in the second direction, and electrically connected to the $2\text{-}1^{st}$ pixel and the $2\text{-}2^{nd}$ pixel.

The display apparatus may further include a shift register distributed in a display area in which the first pixel set and the second pixel set are arranged, the shift register being configured to supply scan signals to the first scan line and the second scan line.

The shift register may include a first distributed circuit disposed between the first pixel set and the second pixel set.

The shift register may include a first distributed circuit disposed between the first pixel set and the second pixel set, a second distributed circuit disposed on one side of the first distributed circuit with the first pixel set disposed between the first distributed circuit and the second distributed circuit, and a third distributed circuit disposed on the other side of the first distributed circuit with the second pixel set disposed between the first distributed circuit and the third distributed circuit.

The display apparatus may further include a connection wire disposed such that the first scan line is disposed between the connection wire and the first pixel set or the second scan line is disposed between the connection wire and the first pixel set, the connection wire being electrically connecting the first to third distributed circuits to each other.

The first distributed circuit, the second distributed circuit, and the third distributed circuit each may include one of a controller, an inverter circuit, an output circuit, and a pull-down circuit.

The first distributed circuit may be the controller, the second distributed circuit may be the inverter circuit, and the third distributed circuit may be the output circuit and the pull-down circuit.

The display apparatus may further include a substrate having an upper surface on which the first pixel set and the second pixel set are arranged, the upper surface having a first edge, a second edge, a third edge, and a fourth edge. A first distance between the display area and the first edge may be greater than a second distance between the display area and the second edge, a third distance between the display area and the third edge, and a fourth distance between the display area and the fourth edge in a plan view.

The display apparatus may further include a data driver disposed between the display area and the first edge.

A distance between the $1\text{-}1^{st}$ pixel and the $1\text{-}2^{nd}$ pixel may be shorter than a distance between the first pixel set and the second pixel set.

The first scan line may be electrically connected to n sub-pixels among then sub-pixels included in the $1\text{-}1^{st}$ pixel and the n sub-pixels included in the $1\text{-}2^{nd}$ pixel, and the second scan line may be electrically connected to the other n sub-pixels.

The first scan line may be electrically connected to sub-pixels included in the $1\text{-}1^{st}$ pixel, and the second scan line may be electrically connected to sub-pixels included in the $1\text{-}2^{nd}$ pixel.

Each of the n first data lines may be electrically connected to one of the n sub-pixels included in the $1\text{-}1^{st}$ pixel and one of the n sub-pixels included in the $1\text{-}2^{nd}$ pixel.

The display apparatus may further include a substrate having an upper surface on which the first pixel set is arranged, the upper surface having a first edge, a second edge, a third edge, and a fourth edge, wherein a first distance between the display area and the first edge is greater than a second distance between the display area and the second edge, a third distance between the display area and the third edge, and a fourth distance between the display area and the fourth edge in a plan view.

The display apparatus may further include a data driver disposed between the display area and the first edge.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
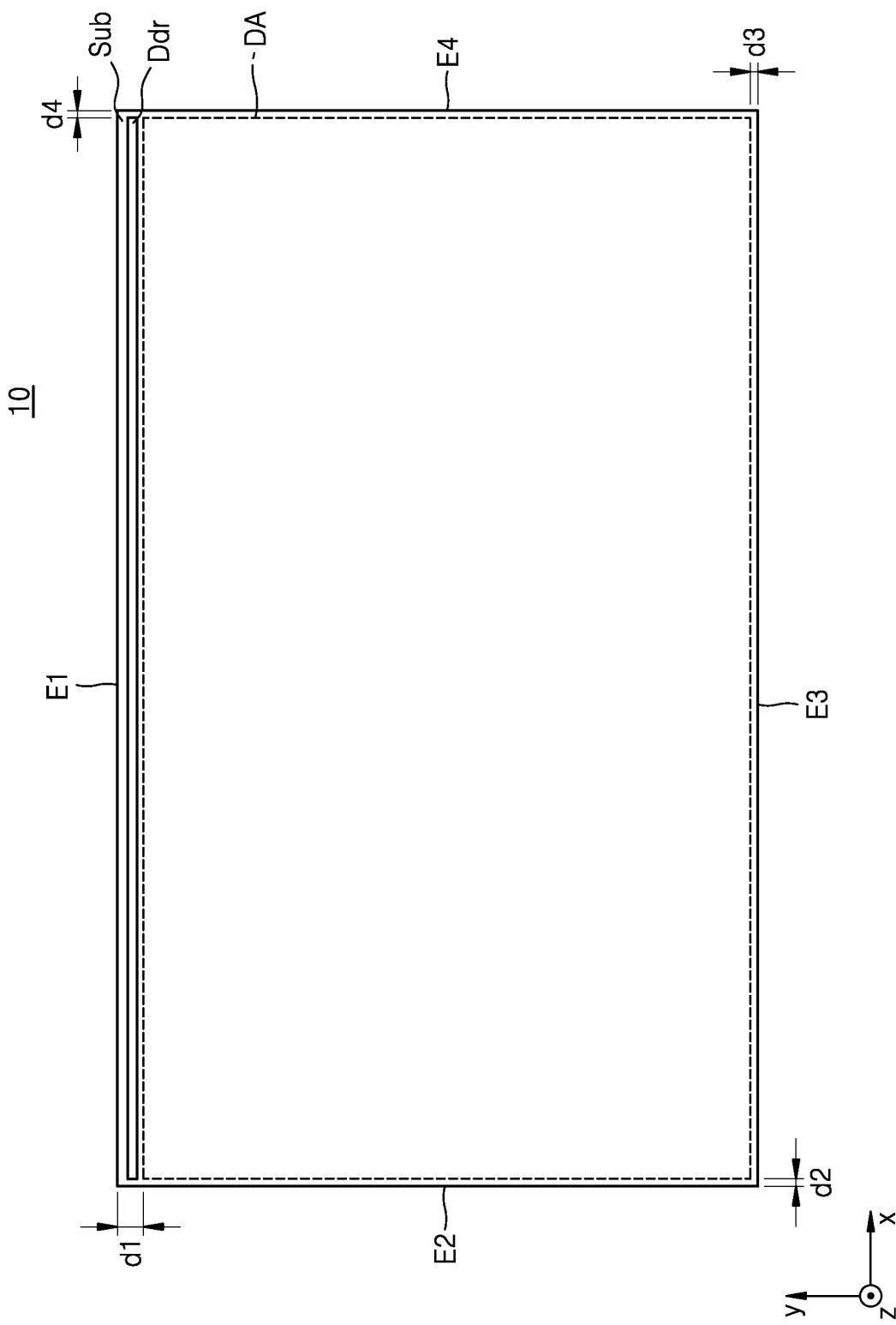
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b, or c" indicates only a, only b, only c, both a and b, both a and c, both b and c, all of a, b, and c, or variations thereof.

As the disclosure allows for various changes and numerous embodiments, embodiments will be illustrated in the drawings and described in detail in the written description. The effect and features of the present embodiments, and a method to achieve the same, will be clearer referring to the detailed descriptions below with the drawings. However, the present embodiments may be implemented in various forms, not by being limited to the embodiments presented below.

Hereinafter, the disclosure will be described in detail by explaining embodiments of the disclosure with reference to the attached drawings. Like reference numerals in the drawings denote like elements.

In the embodiments below, it will be understood that when an element, such as a layer, a film, a region, or a plate, is referred to as being "on" another element, the element can be directly on the other element or intervening elements may be present thereon. Sizes of elements in the drawings may be exaggerated or contracted for convenience of description. In other words, since sizes and thicknesses of elements in the drawings are arbitrarily illustrated for convenience of description, the following embodiments are not limited thereto.

In the embodiments below, the x-axis, the y-axis and the z-axis are not limited to three axes of the rectangular coordinate system and may be interpreted in a broader sense. For example, the x-axis, the y-axis, and the z-axis may be perpendicular to one another, or may represent different directions that are not perpendicular to one another.

FIG. 1 is a schematic plan view of a display apparatus 10 according to an embodiment. The display apparatus 10 according to the embodiment includes a substrate Sub having a display area DA. When viewed from a direction (e.g., z-axis direction) perpendicular to an upper surface of the substrate Sub, i.e., in a plan view, the substrate Sub or the upper surface of the substrate Sub has a first edge E1, a second edge E2, a third edge E3, and a fourth edge E4. A data driver Ddr may be disposed between the first edge E1 of the substrate Sub and the display area DA. Accordingly, when viewed from the direction (e.g., z-axis direction) perpendicular to the upper surface of the substrate Sub, i.e., in a plan view, a first distance d1 between the first edge E1 of the substrate Sub and the display area DA may be greater than a second distance d2 between the second edge E2 of the substrate Sub and the display area DA, a third distance d3 between the third edge E3 of the substrate Sub and the display area DA, and a fourth distance d4 between the fourth edge E4 of the substrate Sub and the display area DA.

Figure 2:
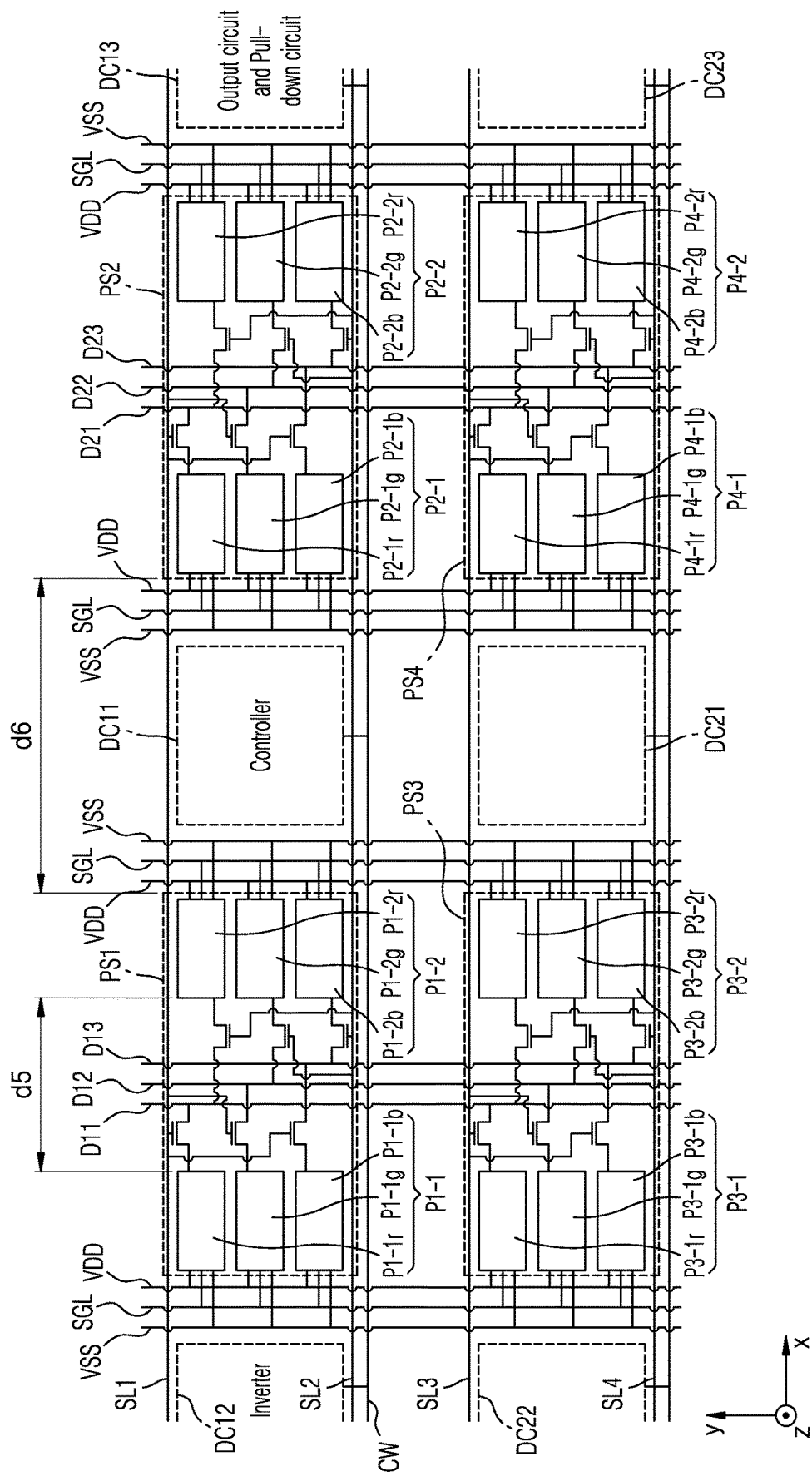
FIG. 2 is a schematic conceptual diagram of a portion of a display area of the display apparatus of FIG. 1.

FIG. 2 is a schematic conceptual diagram of a portion of the display area DA of FIG. 1. As shown in FIG. 2, a first pixel set PS1 is arranged in the display area DA. The display apparatus 10 may include a first scan line SL1, a second scan line SL2, and n first data lines D11, D12, and D13.

The first scan line SL1 extends in a first direction (e.g., x-axis direction), and the second scan line SL2 is spaced apart from the first scan line SL1 and extends in the first direction (e.g., x-axis direction). That is, each of the first scan line SL1 and the second scan line SL2 extend across the display area DA in the first direction (e.g., x-axis direction). Accordingly, the first scan line SL1 and the second scan line SL2 may be substantially parallel to each other. The first scan line SL1 and the second scan line SL2 may be arranged only in the display area DA, or a portion of each of the first scan line SL1 and the second scan line SL2 may also be arranged outside of the display area DA.

The first pixel set PS1 is disposed between the first scan line SL1 and the second scan line SL2. The first pixel set PS1 includes a 1-1$^{st}$ pixel P1-1 and a 1-2$^{nd}$ pixel P1-2, and each of the 1-1$^{st}$ pixel P1-1 and the 1-2$^{nd}$ pixel P1-2 includes n sub-pixels. FIG. 2 illustrates that each of the 1-1$^{st}$ pixel P1-1 and the 1-2$^{nd}$ pixel P1-2 includes three sub-pixels. That is, FIG. 2 illustrates that the 1-1$^{st}$ pixel P1-1 includes a 1-1$^{st}$ red sub-pixel P1-1r, a 1-1$^{st}$ green sub-pixel P1-1g, and a 1-1$^{st}$ blue sub-pixel P1-1b, and the 1-2$^{nd}$ pixel P1-2 includes a 1-2$^{nd}$ red sub-pixel P1-2r, a 1-2$^{nd}$ green sub-pixel P1-2g, and a 1-2$^{nd}$ blue sub-pixel P1-2b. However, the disclosure is not limited thereto, and various modifications may be made. For example, each pixel may include 4 sub-pixels. Also, sub-pixels included in one pixel do not necessarily need to be a red sub-pixel, a green sub-pixel, and a blue sub-pixel, and may also be sub-pixels emitting light having a wavelength belonging to a same wavelength band. In the latter case, the display apparatus 10 may have a color filter corresponding to at least a portion of the sub-pixels to display a full color image. Hereinafter, for convenience of description, a case where each pixel includes 3 sub-pixels will be described.

Then first data lines D11, D12, and D13, which are substantially parallel to each other and spaced apart from each other, each extend in a second direction (e.g., y-axis direction) crossing the first direction. That is, each of the n first data lines D11, D12, and D13 extends across the display area DA in the second direction (e.g., y-axis direction). FIG. 2 illustrates that each of the three first data lines D11, D12, and D13 extends in the second direction (e.g., y-axis direction) crossing the first direction.

The first data lines D11, D12, and D13 each extends outside of the display area DA and is electrically connected to the data driver Ddr disposed between the first edge E1 of the substrate Sub and the display area DA. Also, the first data lines D11, D12, and D13 may pass between the center of the 1-1$^{st}$ pixel P1-1 and the center of the 1-2$^{nd}$ pixel P1-2, and are electrically connected to the 1-1$^{st}$ pixel P1-1 and the 1-2$^{nd}$ pixel P1-2. That is, each of then first data lines D11, D12, and D13 may be electrically connected to one of n sub-pixels included in the 1-1$^{st}$ pixel P1-1 and one of n sub-pixels included in the 1-2$^{nd}$ pixel P1-2.

In detail, the first data line D11 is electrically connected to the 1-1$^{st}$ red sub-pixel P1-1r among the sub-pixels of the 1-1$^{st}$ pixel P1-1 and the 1-2$^{nd}$ red sub-pixel P1-2r among the sub-pixels of the 1-2$^{nd}$ pixel P1-2, the first data line D12 is electrically connected to the 1-1$^{st}$ green sub-pixel P1-1g among the sub-pixels of the 1-1$^{st}$ pixel P1-1 and the 1-2$^{nd}$ green sub-pixel P1-2g among the sub-pixels of the 1-2$^{nd}$ pixel P1-2, and the first data line D13 is electrically connected to the 1-1$^{st}$ blue sub-pixel P1-1b among the sub-pixels of the 1-1$^{st}$ pixel P1-1 and the 1-2$^{nd}$ blue sub-pixel P1-2b among the sub-pixels of the 1-2$^{nd}$ pixel P1-2. As described above, the 1-1$^{st}$ pixel P1-1 and the 1-2$^{nd}$ pixel P1-2 share the first data lines D11, D12, and D13. For example, sub-pixels displaying a same color in the 1-1$^{st}$ pixel P1-1 and the 1-2$^{nd}$ pixel P1-2 may share one data line.

When a scan signal is applied to the first scan line SL1, a data signal is applied to sub-pixels electrically connected to the first scan line SL1. In FIG. 2, because gate electrodes of switching transistors of the 1-1$^{st}$ red sub-pixel P1-1r, the 1-1$^{st}$ green sub-pixel P1-1g, and the 1-1$^{st}$ blue sub-pixel P1-1b included in the 1-1$^{st}$ pixel P1-1 are electrically connected to the first scan line SL1, data signals from the first data lines D11, D12, and D13 are applied to the 1-1$^{st}$ red sub-pixel P1-1r, the 1-1$^{st}$ green sub-pixel P1-1g, and the 1-1$^{st}$ blue sub-pixel P1-1b. Also, when a scan signal is applied to the second scan line SL2, a data signal is applied to sub-pixels electrically connected to the second scan line SL2. In FIG. 2, because gate electrodes of switching transistors of the 1-2$^{nd}$ red sub-pixel P1-2r, the 1-2$^{nd}$ green sub-pixel P1-2g, and the 1-2$^{nd}$ blue sub-pixel P1-2b included in the 1-2$^{nd}$ pixel P1-2 are electrically connected to the second scan line SL2, data signals from the first data lines D11, D12, and D13 are applied to the 1-2$^{nd}$ red sub-pixel P1-2r, the 1-2$^{nd}$ green sub-pixel P1-2g, and the 1-2$^{nd}$ blue sub-pixel P1-2b.

As described above, the 1-1$^{st}$ pixel P1-1 and the 1-2$^{nd}$ pixel P1-2 receive data signals at different times because the first scan line SL1 and the second scan line SL2 are activated at different times. Therefore, even though the 1-1$^{st}$ pixel P1-1 and the 1-2$^{nd}$ pixel P1-2 share the first data lines D11, D12, and D13, an image may be accurately displayed.

As shown in FIG. 2, the display apparatus 10 according to the embodiment may further include n second data lines D21, D22, and D23, and a second pixel set PS2 which is disposed between the first scan line SL1 and the second scan line SL2.

The second pixel set PS2 includes a 2-1$^{st}$ pixel P2-1 and a 2-2$^{nd}$ pixel P2-2, and each of the 2-1$^{st}$ pixel P2-1 and the 2-2$^{nd}$ pixel P2-2 includes n sub-pixels. FIG. 2 illustrates that each of the 2-1$^{st}$ pixel P2-1 and the 2-2$^{nd}$ pixel P2-2 includes three sub-pixels. That is, FIG. 2 illustrates that the 2-1$^{st}$ pixel P2-1 includes a 2-1$^{st}$ red sub-pixel P2-1r, a 2-1$^{st}$ green sub-pixel P2-1g, and a 2-1$^{st}$ blue sub-pixel P2-1b, and the 2-2$^{nd}$ pixel P2-2 includes a 2-2$^{nd}$ red sub-pixel P2-2r, a 2-2$^{nd}$ green sub-pixel P2-2g, and a 2-2$^{nd}$ blue sub-pixel P2-2b. However, the disclosure is not limited thereto, and various modifications may be made. For example, each pixel may include 4 sub-pixels. Also, sub-pixels included in one pixel do not necessarily need to be a red sub-pixel, a green sub-pixel, and a blue sub-pixel, and may also be sub-pixels emitting light having a wavelength belonging to a same wavelength band. In the latter case, the display apparatus 10 may have a color filter corresponding to at least a portion of the sub-pixels to display a full color image. Hereinafter, for convenience of description, a case where each pixel includes 3 sub-pixels will be described.

The n second data lines D21, D22, and D23, which are substantially parallel to each other and spaced apart from each other, each extend in a second direction (e.g., y-axis direction) crossing the first direction. That is, each of the n second data lines D21, D22, and D23 extend across the display area DA in the second direction (e.g., y-axis direction). FIG. 2 illustrates that each of three second data lines D21, D22, and D23 extends in the second direction (e.g., y-axis direction) crossing the first direction. The second data lines D21, D22, and D23 extend outside the display area DA and are electrically connected to the data driver Ddr disposed between the first edge E1 of the substrate Sub and the display area DA. Also, the second data lines D21, D22, and D23 may pass through between the center of the 2-1$^{st}$ pixel P2-1 and the center of the 2-2$^{nd}$ pixel P2-2, and are electrically connected to the 2-1$^{st}$ pixel P2-1 and the 2-2$^{nd}$ pixel P2-2.

In detail, the second data line D21 is electrically connected to the 2-1$^{st}$ red sub-pixel P2-1r among the sub-pixels of the 2-1$^{st}$ pixel P2-1 and the 2-2$^{nd}$ red sub-pixel P2-2r among the sub-pixels of the 2-2$^{nd}$ pixel P2-2, the second data line D22 is electrically connected to the 2-1$^{st}$ green sub-pixel P2-1g among the sub-pixels of the 2-1$^{st}$ pixel P2-1 and the 2-2$^{nd}$ green sub-pixel P2-2g among the sub-pixels of the 2-2$^{nd}$ pixel P2-2, and the second data line D23 is electrically connected to the 2-1$^{st}$ blue sub-pixel P2-1b among the sub-pixels of the 2-1$^{st}$ pixel P2-1 and the 2-2$^{nd}$ blue sub-pixel P2-2b among the sub-pixels of the 2-2$^{nd}$ pixel P2-2. As described above, the 2-1$^{st}$ pixel P2-1 and the 2-2$^{nd}$ pixel P2-2 share the second data lines D21, D22, and D23. For example, sub-pixels displaying a same color in the 2-1$^{st}$ pixel P2-1 and the 2-2$^{nd}$ pixel P2-2 may share one data line.

When a scan signal is applied to the first scan line SL1, a data signal is applied to sub-pixels electrically connected to the first scan line SL1. In FIG. 2, gate electrodes of switching transistors of the 1-1$^{st}$ red sub-pixel P1-1r, the 1-1$^{st}$ green sub-pixel P1-1g, and the 1-1$^{st}$ blue sub-pixel P1-1b included in the 1-1$^{st}$ pixel P1-1, and gate electrodes of switching transistors of the 2-1$^{st}$ red sub-pixel P2-1r, the 2-1$^{st}$ green sub-pixel P2-1g, and the 2-1$^{st}$ blue sub-pixel P2-1b included in the 2-1$^{st}$ pixel P2-1 are electrically connected to the first scan line SL1. Therefore, data signals from the first data lines D11, D12, and D13 are applied to the 1-1$^{st}$ red sub-pixel P1-1r, the 1-1$^{st}$ green sub-pixel P1-1g, and the 1-1$^{st}$ blue sub-pixel P1-1b, respectively, and at the same time, data signals from the second data lines D21, D22, and D23 are applied to the 2-1$^{st}$ red sub-pixel P2-1r, the 2-1$^{st}$ green sub-pixel P2-1g, and the 2-1$^{st}$ blue sub-pixel P2-1b, respectively.

Also, when a scan signal is applied to the second scan line SL2, a data signal is applied to sub-pixels electrically connected to the second scan line SL2. In FIG. 2, gate electrodes of switching transistors of the 1-2$^{nd}$ red sub-pixel P1-2r, the 1-2$^{nd}$ green sub-pixel P1-2g, and the 1-2$^{nd}$ blue sub-pixel P1-2b included in the 1-2$^{nd}$ pixel P1-2, and gate electrodes of switching transistors of the 2-2$^{nd}$ red sub-pixel P2-2r, the 2-2$^{nd}$ green sub-pixel P2-2g, and the 2-2$^{nd}$ blue sub-pixel P2-2b included in the 2-2$^{nd}$ pixel P2-2 are electrically connected to the second scan line SL2. Therefore, data signals from the first data lines D11, D12, and D13 are applied to the 1-2$^{nd}$ red sub-pixel P1-2r, the 1-2$^{nd}$ green sub-pixel P1-2g, and the 1-2$^{nd}$ blue sub-pixel P1-2b, respectively, and at the same time, data signals from the second data lines D21, D22, and D23 are applied to the 2-2$^{nd}$ red sub-pixel P2-2r, the 2-2$^{nd}$ green sub-pixel P2-2g, and the 2-2$^{nd}$ blue sub-pixel P2-2b, respectively.

As described above, the 1-1$^{st}$ pixel P1-1 and the 1-2$^{nd}$ pixel P1-2 receive data signals at different times because the first scan line SL1 and the second scan line SL2 are activated at different times, and the 2-1$^{st}$ pixel P2-1 and the 2-2$^{nd}$ pixel P2-2 receive data signals at different times because the first scan line SL1 and the second scan line SL2 are activated at different times. Therefore, even though the 1-1$^{st}$ pixel P1-1 and the 1-2$^{nd}$ pixel P1-2 share the first data lines D11, D12, and D13, and the 2-1$^{st}$ pixel P2-1 and the 2-2$^{nd}$ pixel P2-2 share the second data lines D21, D22, and D23, an image may be accurately displayed.

Figure 3:
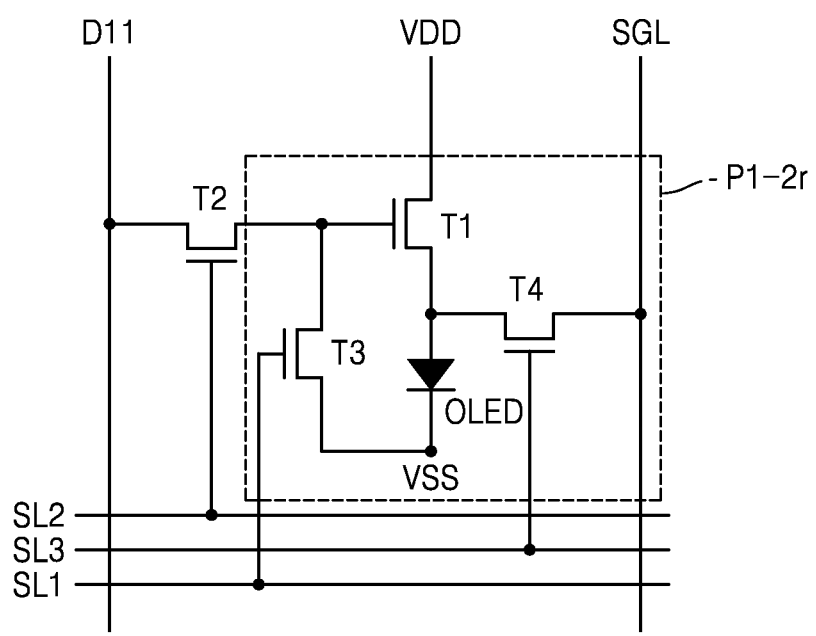
FIG. 3 is an equivalent circuit diagram of a sub-pixel of the display apparatus of FIG. 1.

FIG. 3 is an equivalent circuit diagram of a sub-pixel of FIG. 2. For example, FIG. 3 may be an equivalent circuit diagram of the 1-2$^{nd}$ red sub-pixel P1-2r included in the 1-2$^{nd}$ pixel P1-2 of FIG. 2. Other sub-pixels may have a same and/or similar equivalent circuit diagram. As shown in FIG. 3, the 1-2$^{nd}$ red sub-pixel P1-2r may include a driving transistor T1, a switching transistor T2, a first initialization transistor T3, and a second initialization transistor T4. The 1-2$^{nd}$ red sub-pixel P1-2r may not include some of the above elements as necessary or may further include other transistors or capacitors as necessary.

As described above with reference to FIG. 2, the second scan line SL2 is electrically connected to a gate electrode of the switching transistor T2 of the 1-2$^{nd}$ red sub-pixel P1-2r. The first data line D11 is electrically connected to one of a source electrode and a drain electrode of the switching transistor T2, and the other of the source electrode and the drain electrode of the switching transistor T2 is electrically connected to a gate electrode of the driving transistor T1. Accordingly, when a scan signal is applied to the gate electrode of the switching transistor T2 through the second scan line SL2, a data signal from the first data line D11 is applied to the gate electrode of the driving transistor T1.

One of a source electrode and a drain electrode of the driving transistor T1 is electrically connected to a driving voltage line VDD, and the other of them is electrically connected to a pixel electrode of an organic light-emitting diode OLED. Accordingly, a current corresponding to the data signal applied to the gate electrode of the driving transistor T1 flows from the driving voltage line VDD to the organic light-emitting diode OLED, and light having luminance corresponding to the data signal applied to the gate electrode of the driving transistor T1 is emitted from the organic light-emitting diode OLED. In this regard, an opposite electrode of the organic light-emitting diode OLED is electrically connected to an electrode power line VSS that applies an electrode voltage which is a constant voltage. The opposite electrode of the organic light-emitting diodes OLED may be formed as a single body.

One of a source electrode and a drain electrode of the first initialization transistor T3 may be electrically connected to the gate electrode of the driving transistor T1 and the other of them may be electrically connected to a line that applies a constant voltage. For example, as shown in FIG. 3, the other of the source electrode and the drain electrode of the first initialization transistor T3 may be electrically connected to the electrode power line VSS that applies electrode power. A gate electrode of the first initialization transistor T3 may be electrically connected to the first scan line SL1 which is a previous scan line. The first initialization transistor T3 may transmit a first initialization voltage before the data signal is transmitted to the gate electrode of the driving transistor T1.

One of a source electrode and a drain electrode of the second initialization transistor T4 is electrically connected to the pixel electrode of the organic light-emitting diode OLED, and the other of them is electrically connected to a signal line SGL. Also, a gate electrode of the second initialization transistor T4 is electrically connected to a third scan line SL3 which is a next scan line. The second initialization transistor T4 may be turned on by a signal from the third scan line SL3 to initialize the pixel electrode of the organic light-emitting diode OLED. The second initialization transistor T4 may be omitted as necessary. The third scan line SL3 that applies a signal to the gate electrode of the second initialization transistor T4 may be electrically connected to the second scan line SL2 as necessary.

As shown in FIG. 2, the driving voltage line VDD, the electrode power line VSS, and the signal line SGL, which are spaced apart from each other, extend in the second direction (e.g., y-axis direction) crossing the first direction. That is, the driving voltage line VDD, the electrode power line VSS, and the signal line SGL extend across the display area DA in the second direction (e.g., y-axis direction). Accordingly, the driving voltage line VDD, the electrode power line VSS, and the signal line SGL may be substantially parallel to the first data lines D11, D12, and D13.

As described above, the 1-1$^{st}$ pixel P1-1 and the 1-2$^{nd}$ pixel P1-2 share the first data lines D11, D12, and D13. Accordingly, the first data lines D11, D12, and D13 may pass through between the center of the 1-1$^{st}$ pixel P1-1 and the center of the 1-2$^{nd}$ pixel P1-2. Therefore, the driving voltage line VDD, the electrode power line VSS, and the signal line SGL, which are electrically connected to the 1-1$^{st}$ pixel P1-1, may be disposed at one side of the 1-1$^{st}$ pixel P1-1 opposite to a side at which the 1-2$^{nd}$ pixel P1-2 is disposed (see FIG. 2). In other words, the driving voltage line VDD, the electrode power line VSS, and the signal line SGL which are electrically connected to the 1-1$^{st}$ pixel P1-1 may be disposed such that the center of the 1-1$^{st}$ pixel P1-1 is interposed between the driving voltage line VDD, the electrode power line VSS, and the signal line SGL, and the center of the 1-2$^{nd}$ pixel P1-2. Similarly, the driving voltage line VDD, the electrode power line VSS, and the signal line SGL, which are electrically connected to the 1-2$^{nd}$ pixel P1-2, may be disposed at one side of the 1-2$^{nd}$ pixel P1-2 opposite to a side at which the 1-1$^{st}$ pixel P1-1 is disposed (see FIG. 2). In other words, the driving voltage line VDD, the electrode power line VSS, and the signal line SGL which are electrically connected to the 1-2$^{nd}$ pixel P1-2 may be disposed such that the 1-2$^{nd}$ pixel P1-2 is interposed between the driving voltage line VDD, the electrode power line VSS, and the signal line SGL, and the 1-1$^{st}$ pixel P1-1.

Similarly, the driving voltage line VDD, the electrode power line VSS, and the signal line SGL, which are electrically connected to the 2-1$^{st}$ pixel P2-1, may be disposed at one side of the 2-1$^{st}$ pixel P2-1 opposite to a side at which the 2-2$^{nd}$ pixel P2-2 is disposed. In other words, the driving voltage line VDD, the electrode power line VSS, and the signal line SGL which are electrically connected to the 2-1$^{st}$ pixel P2-1 may be disposed such that the center of the 2-1$^{st}$ pixel P2-1 is interposed between the driving voltage line VDD, the electrode power line VSS, and the signal line SGL, and the center of the 2-2$^{nd}$ pixel P2-2. Similarly, the driving voltage line VDD, the electrode power line VSS, and the signal line SGL, which are electrically connected to the 2-2$^{nd}$ pixel P2-2, may be disposed at one side of the 2-2$^{nd}$ pixel P2-2 opposite to a side at which the 2-1$^{st}$ pixel P2-1 is disposed. In other words, the driving voltage line VDD, the electrode power line VSS, and the signal line SGL which are electrically connected to the 2-2$^{nd}$ pixel P2-2 may be disposed such that the 2-2$^{nd}$ pixel P2-2 is interposed between the driving voltage line VDD, the electrode power line VSS, and the signal line SGL, and the 2-1$^{st}$ pixel P2-1.

The driving voltage line VDD, the electrode power line VSS, and the signal line SGL may extend outside of the display area DA and may be electrically connected to an external printed circuit board or the like, to receive a driving voltage, an electrode voltage, and a signal.

As described above, one side of each of the first data lines D11, D12, and D13 and one side of each of the second data lines D21, D22, and D23 are connected to the data driver Ddr disposed between the first edge E1 of the substrate Sub and the display area DA to transmit data signals to the sub-pixels. As described above, the first scan line SL1 and the second scan line SL2 supply scan signals to the pixels at preset time points, and to this end, the display apparatus 10 according to the embodiment may include a shift register. In this regard, the shift register may be distributed in the display area DA in which the first pixel set PS1, the second pixel set PS2, and the like are arranged, and may supply scan signals to the first scan line SL1 and the second scan line SL2. Accordingly, when viewed from the direction (e.g., z-axis direction) substantially perpendicular to the upper surface of the substrate Sub, i.e., in a plan view, an area of a dead space between the edges of the substrate Sub and the display area DA may be significantly reduced.

In the related art, similar to the data driver Ddr which is disposed between the first edge E1 of the substrate Sub and the display area DA, a shift register is disposed between the display area DA and at least one of the second edge E2 and the fourth edge E4, which are edges extending in a direction crossing the first edge E1 of the substrate Sub. Accordingly, there is a problem in that an area of an entire dead space of the display apparatus is large. However, in the display apparatus 10 according to the embodiment, the shift register may be distributed in the display area DA in which the first pixel set PS1, the second pixel set PS2, and the like are arranged, so as to supply scan signals to the first scan line SL1 and the second scan line SL2. Accordingly, when viewed from the direction (e.g., z-axis direction) substantially perpendicular to the upper surface of the substrate Sub, i.e., in a plan view, an area of a dead space between the edges of the substrate Sub and the display area DA may be significantly reduced.

In detail, the shift register may include a first distributed circuit DC11 which is disposed between the first pixel set PS1 and the second pixel set PS2 as shown in FIG. 2. The shift register may also include other distributed circuits. For example, in addition to the first distributed circuit DC11 which is disposed between the first pixel set PS1 and the second pixel set PS2, the shift register may include a second distributed circuit DC12 arranged at one side of the first pixel set PS1 in a direction (e.g.,–x direction) opposite to a direction to the second pixel set PS2 from the first pixel set PS1, and a third distributed circuit DC13 arranged at one side of the second pixel set PS2 in a direction (e.g., +x direction) opposite to a direction to the first pixel set PS1 from the second pixel set PS2. The second distributed circuit DC12 may be disposed to face the first distributed circuit DC11 such that the first pixel set PS1 is interposed between the second distributed circuit DC12 and the first distributed circuit DC11. The third distributed circuit DC13 may be arranged to face the first distributed circuit DC11 such that the second pixel set PS2 is interposed between the third distributed circuit DC13 and the first distributed circuit DC11. The distributed circuits and the pixel sets may be disposed alternately along a first direction (e.g., x-axis direction) along which scan lines extend.

Figure 4:
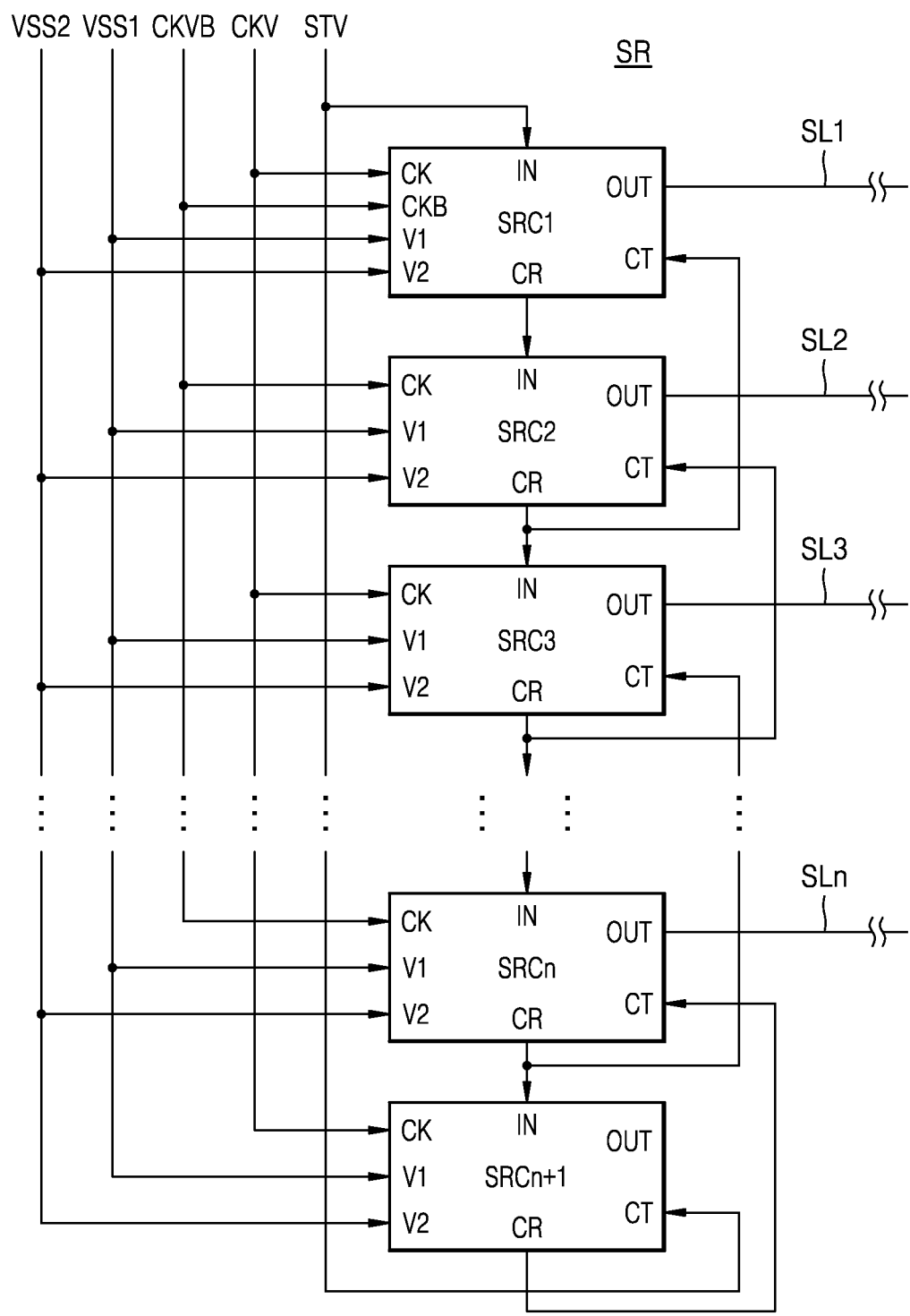
FIG. 4 is a block diagram of a shift register in a display area of the display apparatus of FIG. 1.

FIG. 4 is a block diagram of a shift register SR in the display area DA of FIG. 1. As shown in FIG. 4, the shift register SR may include a plurality of driving stages SRC1 to SRCn and a dummy driving stage SRCn+1. The driving stages SRC1 to SRCn and the dummy driving stage SRCn+1 have an interdependent relationship such that one driving stage operates in response to a carry signal output from a previous driving stage and a carry signal output from a next driving stage.

The driving stages SRC1 to SRCn are connected to scan lines SL1 to SLn. Accordingly, an output terminal OUT of each of the driving stages SRC1 to SRCn provides a scan signal to a corresponding one of the scan lines SL1 to SLn.

A first driving stage SRC1 provides a scan signal to the first scan line SL1, and a second driving stage SRC2 provides a scan signal to the second scan line SL2. Thus, the first driving stage SRC1 may be distributed along the first scan line SL1. For example, the first driving stage SRC1 may include the above-described first distributed circuit DC11, second distributed circuit DC12, and/or third distributed circuit DC13 which are disposed between the first scan line SL1 and the second scan line SL2. The second driving stage SRC2 may also be distributed along the second scan line SL2. That is, the second driving stage SRC2 may include distributed circuits which are disposed between the first scan line SL1 and the second scan line SL2. Because the first scan line SL1 and the second scan line SL2 extend lengthwise in the first direction (e.g., x-axis direction), the distributed circuits included in the first driving stage SRC1 and the distributed circuits included in the second driving stage SRC2 may be distributed between the first scan line SL1 and the second scan line SL2.

As described above with reference to FIG. 2, data signals may be applied to six sub-pixels included in the first pixel set PS1 using the first scan line SL1, the second scan line SL2, and the three first data lines D11, D12, and D13. Alternatively, data signals may be applied to six sub-pixels included in the first pixel set PS1 using three scan lines and two data lines. However, when the three scan lines are used, three driving stages are required, and thus the number of driving stages to be distributed in the display area DA may increase. In the display apparatus 10 according to the embodiment, because the data signals are applied to the six sub-pixels by using the two scan lines and the three data lines, the number of driving stages to be distributed in the display area DA may be significantly reduced.

Each of the driving stages SRC1 to SRCn and the dummy driving stage SRCn+1 may include an output terminal OUT, a carry terminal CR, an input terminal IN, a control terminal CT, a clock terminal CK, a first voltage input terminal V1, and a second voltage input terminal V2.

A corresponding scan line is electrically connected to the output terminal OUT of each of the driving stages SRC1 to SRCn, and thus a scan signal is transmitted to the scan line. The carry terminal CR of each of the driving stages SRC1 to SRCn is electrically connected to an input terminal IN of a next driving stage of the corresponding driving stage. For example, the carry terminal CR of the third driving stage SRC3 is electrically connected to the input terminal IN of the fourth driving stage SRC4 which is a next driving stage. The carry terminal CR of each of the driving stages SRC1 to SRCn outputs a carry signal.

The input terminal IN of each of the driving stages SRC1 to SRCn receives a carry signal of a previous driving stage of the corresponding driving stage. For example, the input terminal IN of the third driving stage SRC3 receives a carry signal of the second driving stage SRC2 which is a previous driving stage.

The control terminal CT of each of the driving stages SRC1 to SRCn receives a carry signal of a next driving stage of the corresponding driving stage. For example, the control terminal CT of the third driving stage SRC3 receives a carry signal of the fourth driving stage SRC4 which is a next driving stage. However, the control terminal CT of the dummy driving stage SRCn+1 at the end may receive a start signal STV.

The clock terminal CK of each of the driving stages SRC1 to SRCn may receive a first clock signal CKV or a second clock signal CKVB. For example, clock terminals CK of odd-numbered driving stages SRC1, SRC3, and SRC5 among the driving stages SRC1 to SRCn may receive the first clock signal CKV. Clock terminals CK of even-numbered driving stages SRC2 and SRCn among the driving stages SRC1 to SRCn may receive the second clock signal CKVB. The first clock signal CKV and the second clock signal CKVB may have different phases. For example, the second clock signal CKVB may be a signal obtained by inverting the first clock signal CKV.

The first voltage input terminal V1 of each of the driving stages SRC1 to SRCn receives a first discharge voltage VSS1. The second voltage input terminal V2 of each of the driving stages SRC1 to SRCn receives a second discharge voltage VSS2. The second discharge voltage VSS2 may have a voltage level lower than that of the first discharge voltage VSS1.

According to a circuit configuration, in each of the driving stages SRC1 to SRCn, any one of the output terminal OUT, the input terminal IN, the carry terminal CR, the control terminal CT, the clock terminal CK, the first voltage input terminal V1, and the second voltage input terminal V2 may be omitted, or other terminals may be further included. For example, any one of the first voltage input terminal V1 and the second voltage input terminal V2 may be omitted. Also, a connection relationship among the driving stages SRC1 to SRCn may be changed.

The first driving stage SRC1, which is a first driving stage among the driving stages SRC1 to SRCn, may have a structure different from those of the other driving stages SRC2 to SRCn. For example, the second driving stage SRC2 to the n-th driving stage SRCn may receive a carry signal of a previous driving stage through each input terminal IN, whereas the first driving stage SRC1 may receive a start signal STV through the input terminal IN. Also, the second driving stage SRC2 to the n-th driving stage SRCn may receive any one of the first clock signal CKV and the second clock signal CKVB through each clock terminal CK, whereas the first driving stage SRC1 may further include an inverted clock terminal CKB, and thus may receive the first clock signal CKV through the clock terminal CK and the second clock signal CKVB through the inverted clock terminal CKB, respectively.

Figure 5:
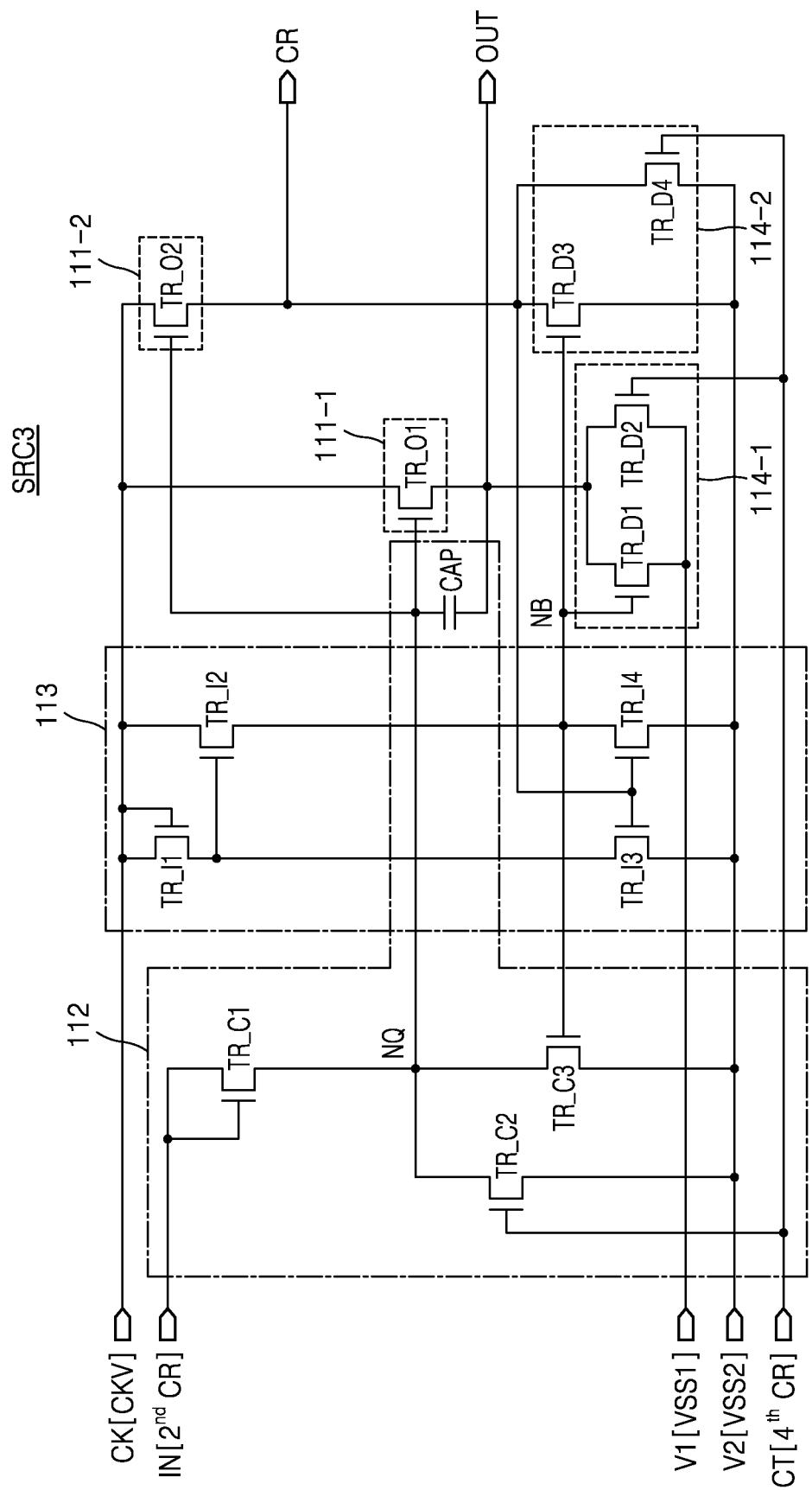
FIG. 5 is a circuit diagram of a third driving stage included in a shift register of the display apparatus of FIG. 1.

FIG. 5 is a circuit diagram illustrating the third driving stage SRC3 among the driving stages included in the shift register SR of FIG. 4. The other driving stages except for the first driving stage SRC1 may also have a same/similar structure as the third driving stage SRC3.

The third driving stage SRC3 includes output circuits 111-1 and 111-2, a controller 112, an inverter circuit 113, and pull-down circuits 114-1 and 114-2. The output circuits 111-1 and 111-2 include a first output circuit 111-1 that outputs a third scan signal to be applied to the third scan line SL3, and a second output circuit 111-2 that outputs a third carry signal. The pull-down circuits 114-1 and 114-2 include a first pull-down circuit 114-1 that pulls down the output terminal OUT and a second pull-down circuit 114-2 that pulls down the carry terminal CR. A circuit of the third driving stage SRC3 is merely an example, and thus may be changed.

The first output circuit 111-1 includes a first output transistor TR_O1. The first output transistor TR_O1 includes an input electrode that receives the first clock signal CKV, a control electrode connected to a first node NQ (or a control node), and an output electrode connected to the output terminal OUT to output a third scan signal. The first output transistor TR_O1 outputs a third scan signal based on the first clock signal CKV in response to a voltage of the first node NQ.

The second output circuit 111-2 includes a second output transistor TR_O2. The second output transistor TR_O2 includes an input electrode that receives the first clock signal CKV, a control electrode connected to the first node NQ, and an output electrode that outputs a third carry signal. The second output transistor TR_O2 outputs a third carry signal based on the first clock signal CKV in response to a voltage of the first node NQ.

The controller 112 controls operations of the first output circuit 111-1 and the second output circuit 111-2. The controller 112 receives a second carry signal output from the second driving stage SRC2 (i.e., a previous driving stage) through the input terminal IN. The controller 112 turns on the first output circuit 111-1 and the second output circuit 111-2 in response to the second carry signal received through the input terminal IN. The controller 112 turns off the first output circuit 111-1 and the second output circuit 111-2 in response to a fourth carry signal output from the fourth driving stage SRC4 (i.e., a next driving stage). For example, the controller 112 may maintain the first output circuit 111-1 and the second output circuit 111-2 to be in a turn-off state according to a switching signal output from the inverter circuit 113.

The controller 112 includes a first control transistor TR_C1, a second control transistor TR_C2, a third control transistor TR_C3, and a capacitor CAP.

The first control transistor TR_C1 includes an output electrode connected to the first node NQ, and a control electrode and an input electrode commonly connected to the input terminal IN. The first control transistor TR_C1 may be diode-connected so that a current path is formed from the input terminal IN to the first node NQ. The first control transistor TR_C1 may provide, to the first node NQ, a signal (i.e., the second carry signal) received from the input terminal IN. An electric potential of the first node NQ may increase by the second carry signal provided from the first control transistor TR_C1.

The capacitor CAP may be connected between a control terminal CT and an output electrode of the first output transistor TR_O1 of the first output circuit 111-1. The capacitor CAP may be connected between the output terminal OUT and the first node NQ.

The second control transistor TR_C2 may be connected between the second voltage input terminal V2 and the first node NQ. A control electrode of the second control transistor TR_C2 is connected to the control terminal CT. The second control transistor TR_C2 provides the second discharge voltage VSS2 to the first node NQ in response to a fourth carry signal provided from the control terminal CT.

The third control transistor TR_C3 may be connected between the second voltage input terminal V2 and the first node NQ. A control electrode of the third control transistor TR_C3 is connected to a second node NB (or an output node). The second node NB is connected to an output terminal of the inverter circuit 113. The third control transistor TR_C3 provides the second discharge voltage VSS2 to the first node NQ in response to the switching signal output from the inverter circuit 113.

The number of second control transistors TR_C2 or the number of third control transistors TR_C3 may be more than one. When the number of the second control transistors TR_C2 or the number of the third control transistors TR_C3 increases, the transistors may be connected in series with each other. Also, any one of the second control transistor TR_C2 and the third control transistor TR_C3 may be connected to the first voltage input terminal V1 instead of the second voltage input terminal V2.

The inverter circuit 113 outputs a switching signal of the second node NB. The inverter circuit 113 includes a first inverter transistor TR_I1, a second inverter transistor TR_I2, a third inverter transistor TR_I3, and a fourth inverter transistor TR_I4. The first inverter transistor TR_I1 includes an input electrode and a control electrode commonly connected to the clock terminal CK, and an output electrode connected to a control electrode of the second inverter transistor TR_I2. The second inverter transistor TR_I2 includes an input electrode connected to the clock terminal CK and an output electrode connected to the second node NB.

The third inverter transistor TR_I3 includes an output electrode connected to the output electrode of the first inverter transistor TR_I1, a control electrode connected to the carry terminal CR, and an input electrode connected to the second voltage input terminal V2. The fourth inverter transistor TR_I4 includes an output electrode connected to the second node NB, a control electrode connected to the carry terminal CR, and an input electrode connected to the second voltage input terminal V2.

The first pull-down circuit 114-1 includes a first pull-down transistor TR_D1 and a second pull-down transistor TR_D2. The first pull-down transistor TR_D1 includes an input electrode connected to the first voltage input terminal V1, a control electrode connected to the second node NB, and an output electrode connected to the output terminal OUT. The second pull-down transistor TR_D2 includes an input electrode connected to the first voltage input terminal V1, a control electrode connected to the control terminal CT, and an output electrode connected to the output terminal OUT. At least one of the input electrode of the first pull-down transistor TR_D1 and the input electrode of the second pull-down transistor TR_D2 may be connected to the second voltage input terminal V2.

The second pull-down circuit 114-2 includes a third pull-down transistor TR_D3 and a fourth pull-down transistor TR_D4. The third pull-down transistor TR_D3 includes an input electrode connected to the second voltage input terminal V2, a control electrode connected to the second node NB, and an output electrode connected to the carry terminal CR. The fourth pull-down transistor TR_D4 includes an input electrode connected to the second voltage input terminal V2, a control electrode connected to the control terminal CT, and an output electrode connected to the carry terminal CR. For example, at least one of the input electrode of the third pull-down transistor TR_D3 and the input electrode of the fourth pull-down transistor TR_D4 may be connected to the first voltage input terminal V1.

Figure 6:
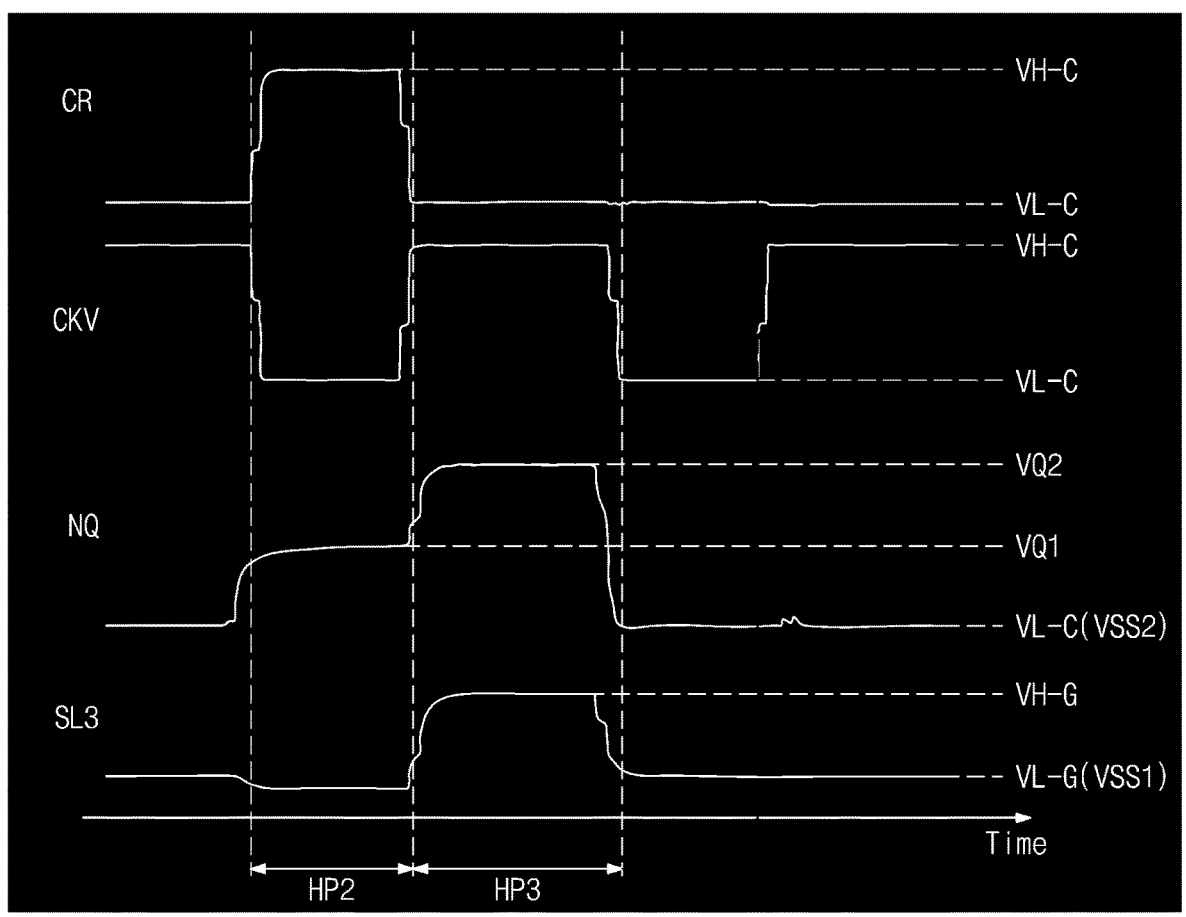
FIG. 6 is a waveform diagram for describing an operation of a third driving stage of the display apparatus of FIG. 1.

FIG. 6 is a waveform diagram for describing an operation of the third driving stage SRC3 of FIG. 5. Referring to FIGS. 5 and 6, the third driving stage SRC3 receives a carry signal from the second driving stage SRC2 through the input terminal IN. The carry signal may have a high voltage VH-C during a second horizontal period HP2. The first control transistor TR_C1 of the third driving stage SRC3 may provide a carry signal having the high voltage VH-C to the first node NQ during the second horizontal period HP2. In this regard, the first node NQ may be precharged with a first voltage VQ1. For example, the first voltage VQ1 may be lower than the high voltage VH-C of the carry signal by a predetermined voltage level. For example, the high voltage VH-C may be about 10 V, and a low voltage VL-C may be about −16 V. The low voltage VL-C and the second discharge voltage VSS2 may have a same voltage level.

In a third horizontal period HP3, the carry signal from the second driving stage SRC2 may drop to the low voltage VL-C and the first clock signal CKV may rise to the high voltage VH-C. Because the first node NQ is precharged with the first voltage VQ1 in the second horizontal period HP2, the first output transistor TR_O1 and the second output transistor TR_O2 of the third driving stage SRC3 may be in a turn-on state. As the first clock signal CKV rises to the high voltage VH-C during the third horizontal period HP3, the first node NQ of the third driving stage SRC3 is charged with a second voltage VQ2, and thus the first output transistor TR_O1 may output a scan signal of a high voltage VH-G to be applied to the third scan line SL3 and the second output transistor TR_O2 may output a carry signal of the third driving stage SRC3.

In a fourth horizontal period HP4, the first clock signal CKV drops to the low voltage VL-C and the carry signal from the fourth driving stage SRC4 rises to the high voltage VH-C. In the fourth horizontal period HP4, the inverter circuit 113 of the third driving stage SRC3 outputs a signal obtained by inverting the first clock signal CKV, as the switching signal of the second node NB. In the fourth horizontal period HP4, the first pull-down circuit 114-1 and the second pull-down circuit 114-2 of the third driving stage SRC3 drop the scan signal to be applied to the third scan line SL3 to a low voltage VL-G and the carry signal of the third driving stage SRC3 to the low voltage VL-C in response to the switching signal of the second node NB and the carry signal from the fourth driving stage SRC4.

The second driving stage SRC2 and the fourth driving stage SRC4 to the n-th driving stage SRCn may also output a scan signal and a carry signal based on the above-described operating method.

Figure 7:
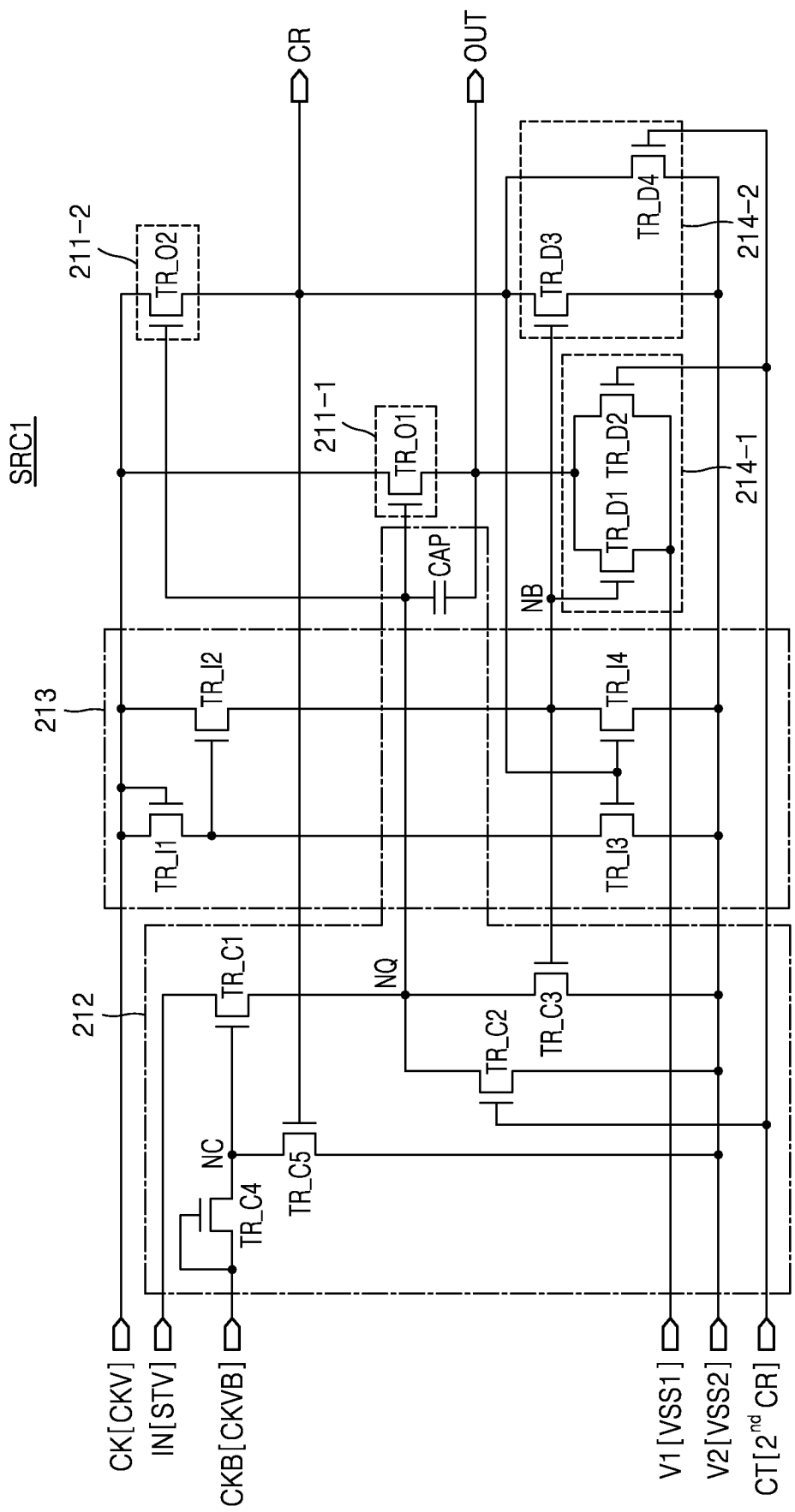
FIG. 7 is a circuit diagram of a first driving stage included in a shift register of the display apparatus of FIG. 1.

FIG. 7 is a circuit diagram illustrating the first driving stage SRC1 among the plurality of driving stages of FIG. 4. Hereinafter, for convenience of description, parts overlapping with the description of the third driving stage SRC3 will be omitted, and differences between the first driving stage SRC1 and the third driving stage SRC3 will be briefly described.

The first driving stage SRC1 includes output circuits 211-1 and 211-2, a controller 212, an inverter circuit 213, and pull-down circuits 214-1 and 214-2. The output circuits 211-1 and 211-2 include a first output transistor TR_O1 and a second output transistor TR_O2. The inverter circuit 213 includes first to fourth inverter transistors TR_I1 to TR_I4.

The pull-down circuits 214-1 and 214-2 include first to fourth pull-down transistors TR_D1 to TR_D4. The output circuits 211-1 and 211-2, the inverter circuit 213, and the pull-down circuits 214-1 and 214-2 are the same as the output circuits 111-1 and 111-2, the inverter circuit 113, and the pull-down circuits 114-1 and 114-2 of the third driving stage SRC3 of FIG. 5, and thus descriptions thereof will be omitted.

The controller 212 includes a first control transistor TR_C1, a second control transistor TR_C2, a third control transistor TR_C3, a fourth control transistor TR_C4, a fifth control transistor TR_C5, and a capacitor CAP. The first control transistor TR_C1 includes an input electrode connected to the input terminal IN, a control electrode connected to a third node NC, and an output electrode connected to the first node NQ. The first control transistor TR_C1 may provide, to the first node NQ, a signal received from the input terminal IN in response to a voltage of the third node NC. The first node NQ is precharged with the first voltage VQ1 by the signal provided through the first control transistor TR_C1. For example, the first driving stage SRC1 receives a start signal STV through the input terminal IN. That is, the first control transistor TR_C1 may provide the start signal STV to the first node NQ.

Because the second control transistor TR_C2 and the third control transistor TR_C3 have been described above with reference to FIG. 5, descriptions thereof will be omitted.

The fourth control transistor TR_C4 includes an input electrode and a control electrode commonly connected to the inverted clock terminal CKB and an output electrode connected to the third node NC. The fourth control transistor TR_C4 is diode-connected so that a current path is formed from the inverted clock terminal CKB to the third node NC. The fourth control transistor TR_C4 may provide, to the third node NC, a second clock signal CKVB provided from the inverted clock terminal CKB. Accordingly, the first control transistor TR_C1 may be driven in response to the second clock signal CKVB provided from the inverted clock terminal CKB.

The fifth control transistor TR_C5 includes an input electrode connected to the second voltage input terminal V2, a control electrode connected to the carry terminal CR, and an output electrode connected to the third node NC. The fifth control transistor TR_C5 may provide, to the third node NC, a second discharge voltage VSS2 provided from the second voltage input terminal V2 in response to the carry signal of the first driving stage SRC1.

Figure 8:
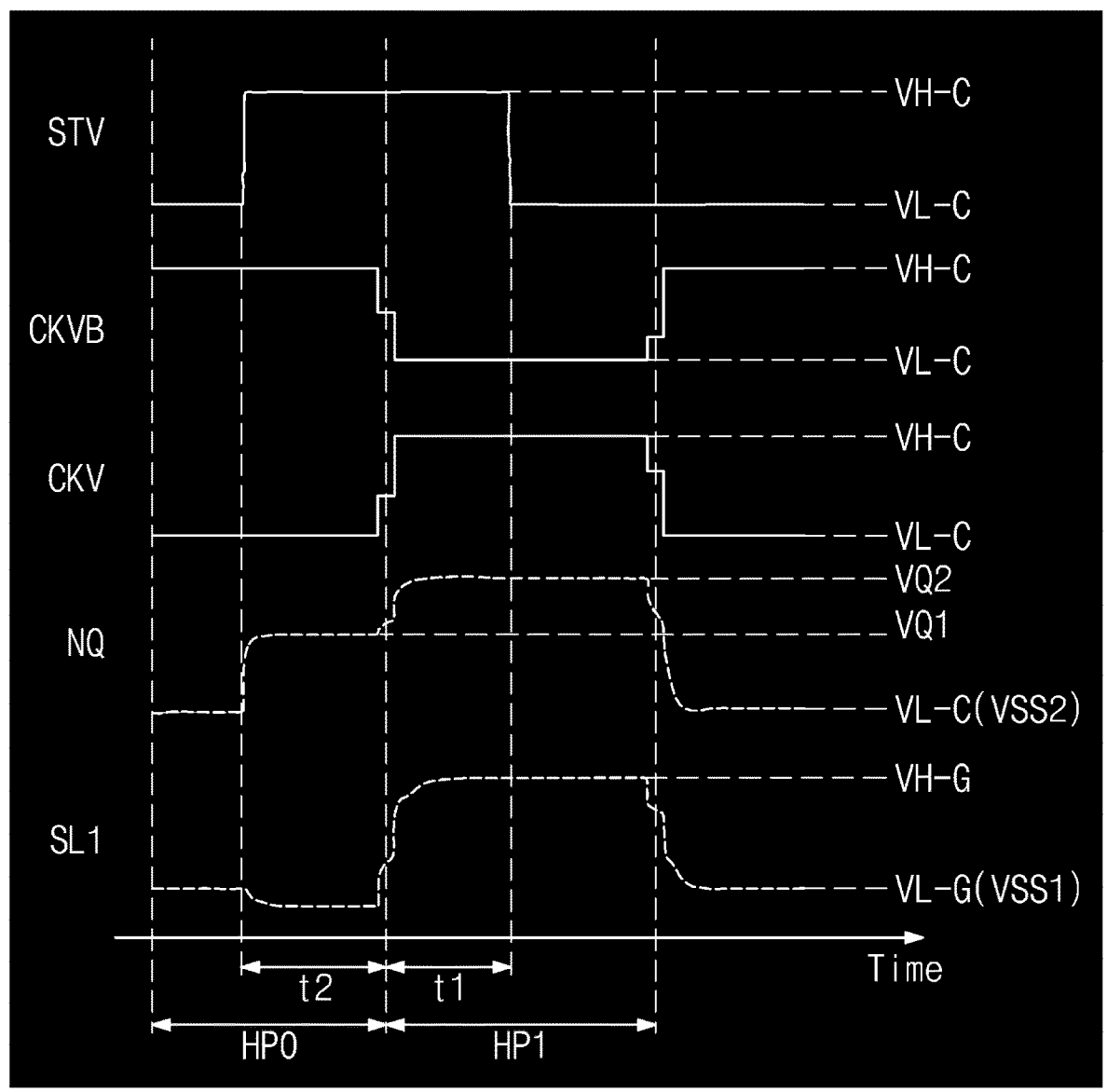
FIG. 8 is a waveform diagram for describing an operation of a first driving stage of the display apparatus of FIG. 1.

FIG. 8 is a waveform diagram for describing an operation of the first driving stage SRC1 of FIG. 7. In an ideal case, the start signal STV is a high voltage VH-C during a zeroth horizontal period HP0, but the start signal STV may be delayed by a first time t1 as shown in FIG. 8. That is, a period during which the start signal STV is at the high voltage VH-C may overlap a portion of the zeroth horizontal period HP0 and a portion of a first horizontal period HP1. The zeroth horizontal period HP0 may be a first horizontal period of a corresponding frame period.

In an ideal case, a precharging time of the first node NQ of the first driving stage SRC1 may be the zeroth horizontal period HP0. However, as the start signal STV is delayed by the first time t1, the precharging time of the first node NQ of the first driving stage SRC1 is reduced to a second time t2.

However, because the first control transistor TR_C1 of the first driving stage SRC1 is driven by the second clock signal CKVB to provide the start signal STV to the first node NQ, a voltage of the first node NQ may be precharged up to the first voltage VQ1 during the second time t2. That is, the voltage of the first node NQ may be sufficiently precharged up to the first voltage VQ1.

Thereafter, the start signal STV may drop to the low voltage VL-C in the middle of the first horizontal period HP1. In this regard, the first control transistor TR_C1 of the first driving stage SRC1 is driven by the second clock signal CKVB, and thus maintains a turn-off state during the first horizontal period HP1. That is, because the first control transistor TR_C1 that provides the start signal STV to the first node NQ maintains a turn-off state during the first horizontal period HP1, the voltage of the first node NQ may be maintained constant even when the start signal STV drops to the low voltage VL-C.

As described above with reference to FIG. 2, the first driving stage SRC1 may be distributed in several areas between the first scan line SL1 and the second scan line SL2. For example, the first distributed circuit DC11 which includes the controller 212 may be disposed between the first pixel set PS1 and the second pixel set PS2, the second distributed circuit DC12 which include the inverter circuit 213 may be disposed on the opposing side of the first distributed circuit DC11 with reference to the first pixel set PS1, and the third distributed circuit DC13 which includes the output circuits 211-1 and 211-2 and the pull-down circuits 214-1 and 214-2 may be disposed on the opposing side of the first distributed circuit DC11 with reference to the second pixel set PS2.

The first distributed circuit DC11, the second distributed circuit DC12, and the third distributed circuit DC13 need to be electrically connected to each other. To this end, a connection wire CW arranged at one side of the first scan line SL1 in a direction (e.g., +y direction) opposite to a direction to the second scan line SL2 from the first scan line SL1 or at one side of the second scan line SL2 in a direction (e.g., −y direction) opposite to a direction to the first scan line SL1 from the second scan line SL2 may be further included. In other words, the connection wire CW may be arranged to face away from the second scan line SL2 such that the first scan line SL1 is interposed between the connection wire CW and the second scan line SL2 or may be arranged to face away from the first scan line SL1 such that the second scan line SL2 is interposed between the connection wire CW and the first scan line SL1. The connection wire CW may electrically connect the first to third distributed circuits DC11 to DC13. In FIG. 2, the connection wire CW is disposed at one side of the second scan line SL2 in a direction (e.g., −y direction) opposite to a direction to the first scan line SL1 from the second scan line SL2.

As described above, because the first distributed circuit DC11 is disposed between the first pixel set PS1 and the second pixel set PS2, a distance d5 between the 1-$1^{st}$ pixel P1-1 and the 1-$2^{nd}$ pixel P1-2 included in the first pixel set PS1 may be shorter than a distance d6 between the first pixel set PS1 and the second pixel set PS2.

As shown in FIG. 2, the third scan line SL3 may be arranged in the direction (e.g., −y direction) opposite to the direction to the first scan line SL1 with respect to the second scan line SL2, and a fourth scan line SL4 may be arranged in the direction (e.g., −y direction) opposite to the direction to the second scan line SL2 with respect to the third scan line SL3. In other words, the third scan line SL3 may be arranged to face away from the first scan line SL1 such that the second scan line SL2 is interposed between the third scan line SL3 and the first scan line SL1, and the fourth scan line SL4 may be arranged to face away from the second scan line SL2 such that the third scan line SL3 is interposed between the fourth scan line SL4 and the second scan line SL2. A third pixel set PS3 and a fourth pixel set PS4 may be disposed between the third scan line SL3 and the fourth scan line SL4. The third pixel set PS3 and the fourth pixel set PS4 may have the same configuration as the first pixel set PS1 and the second pixel set PS2, respectively.

That is, the third pixel set PS3 may include a 3-1$^{st}$ pixel P3-1 including n sub-pixels and a 3-2$^{nd}$ pixel P3-2 including n sub-pixels. FIG. 2 illustrates that the 3-1$^{st}$ pixel P3-1 includes a 3-1$^{st}$ red sub-pixel P3-1r, a 3-1$^{st}$ green sub-pixel P3-1g, and a 3-1$^{st}$ blue sub-pixel P3-1b, and the 3-2$^{nd}$ pixel P3-2 includes a 3-2$^{nd}$ red sub-pixel P3-2r, a 3-2$^{nd}$ green sub-pixel P3-2g, and a 3-2$^{nd}$ blue sub-pixel P3-2b. The fourth pixel set PS4 may include a 4-1$^{st}$ pixel P4-1 including n sub-pixels and a 4-2$^{nd}$ pixel P4-2 including n sub-pixels. FIG. 2 illustrates that the 4-1$^{st}$ pixel P4-1 includes a 4-1$^{st}$ red sub-pixel P4-1r, a 4-1$^{st}$ green sub-pixel P4-1g, and a 4-1$^{st}$ blue sub-pixel P4-1b, and the 4-2$^{nd}$ pixel P4-2 includes a 4-2$^{nd}$ red sub-pixel P4-2r, a 4-2$^{nd}$ green sub-pixel P4-2g, and a 4-2$^{nd}$ blue sub-pixel P4-2b.

As described above, the first data lines D11, D12, and D13 may pass between the center of the 1-1$^{st}$ pixel P1-1 and the center of the 1-2$^{nd}$ pixel P1-2, and may be electrically connected to the 1-1$^{st}$ pixel P1-1 and the 1-2$^{nd}$ pixel P1-2, at the same time, may pass between the center of the 3-1$^{st}$ pixel P3-1 and the center of the 3-2$^{nd}$ pixel P3-2, and may be electrically connected to the 3-1$^{st}$ pixel P3-1 and the 3-2$^{nd}$ pixel P3-2. A connection relationship among the first data lines D11, D12, and D13, the 3-1$^{st}$ pixel P3-1, and the 3-2$^{nd}$ pixel P3-2 may be the same as a connection relationship among the first data lines D11, D12, and D13, the 1-1$^{st}$ pixel P1-1, and the 1-2$^{nd}$ pixel P1-2, and thus descriptions thereof will be omitted.

As described above, the second data lines D21, D22, and D23 may pass between the center of the 2-1$^{st}$ pixel P2-1 and the center of the 2-2$^{nd}$ pixel P2-2, and may be electrically connected to the 2-1$^{st}$ pixel P2-1 and the 2-2$^{nd}$ pixel P2-2, and at the same time, may pass between the center of the 4-1$^{st}$ pixel P4-1 and the center of the 4-2$^{nd}$ pixel P4-2, and may be electrically connected to the 4-1$^{st}$ pixel P4-1 and the 4-2$^{nd}$ pixel P4-2. A connection relationship among the second data lines D21, D22, and D23, the 4-1$^{st}$ pixel P4-1, and the 4-2$^{nd}$ pixel P4-2 may be the same as a connection relationship among the second data lines D21, D22, and D23, the 2-1$^{st}$ pixel P2-1, and the 2-2$^{nd}$ pixel P2-2, and thus descriptions thereof will be omitted.

When a scan signal is applied to the third scan line SL3, data signals from the first data lines D11, D12, and D13 are applied to the 3-1$^{st}$ pixel P3-1, and data signals from the second data lines D21, D22, and D23 are applied to the 4-1$^{st}$ pixel P4-1. Also, when a scan signal is applied to the fourth scan line SL4, data signals from the first data lines D11, D12, and D13 are applied to the 3-2$^{nd}$ pixel P3-2, and data signals from the second data lines D21, D22, and D23 are applied to the 4-2$^{nd}$ pixel P4-2.

Even between the third scan line SL3 and the fourth scan line SL4, circuits included in a third driving stage SRC3, which may apply scan signals to the third scan line SL3, may be distributed in a fourth distributed circuit DC21, a fifth distributed circuit DC22, and a sixth distributed circuit DC23.

Although the first scan line SL1 is electrically connected to the sub-pixels included in the 1-1$^{st}$ pixel P1-1, and the second scan line SL2 is electrically connected to the sub-pixels included in the 1-2$^{nd}$ pixel P1-2, the disclosure is not limited thereto. For example, the first scan line SL1 may be electrically connected to the 1-1$^{st}$ red sub-pixel P1-1r and the 1-1$^{st}$ green sub-pixel P1-1g among the sub-pixels included in the 1-1$^{st}$ pixel P1-1 and may be electrically connected to the 1-2$^{nd}$ blue sub-pixel P1-2b among the sub-pixels included in the 1-2$^{nd}$ pixel P1-2. The second scan line SL2 may be electrically connected to the 1-1$^{st}$ blue sub-pixel P1-1b among the sub-pixels included in the 1-1$^{st}$ pixel P1-1 and may be electrically connected to the 1-2$^{nd}$ red sub-pixel P1-2r and the 1-2$^{nd}$ green sub-pixel P1-2g among the sub-pixels included in the 1-2$^{nd}$ pixel P1-2. That is, the first scan line SL1 may be electrically connected to n sub-pixels among n sub-pixels included in the 1-Pt pixel P1-1 and n sub-pixels included in the 1-2$^{nd}$ pixel P1-2, and the second scan line SL2 may be electrically connected to the other n sub-pixels. This may also apply to a connection relationship between the first and second scan lines SL1 and SL2 and sub-pixels included in the 2-1$^{st}$ pixel P2-1 and the 2-2$^{nd}$ pixel P2-2.

Figure 9:
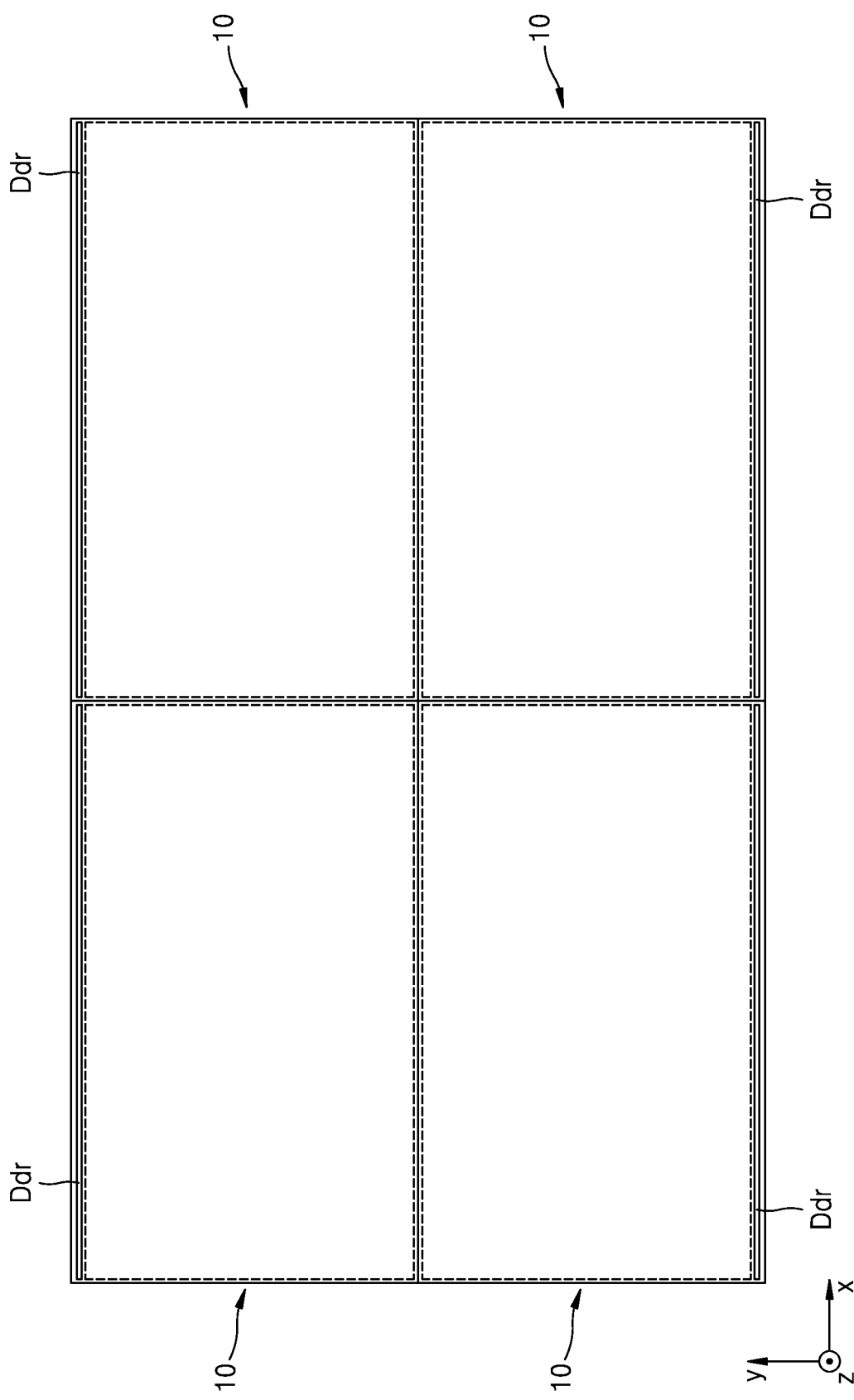
FIG. 9 is a schematic plan view of a display apparatus according to another embodiment.

FIG. 9 is a schematic plan view of a tiled display apparatus according to another embodiment. The tiled display apparatus according to the embodiment includes four display apparatuses 10 arranged in a tile form so as to be adjacent to each other. In this case, each of the four display apparatuses 10 according to the above-described embodiments may be referred to as a sub-display apparatus. Because each of the sub-display apparatuses has a data driver Ddr at only one edge thereof and shift register is distributed in a display area, the sub-display apparatuses may be arranged so that edges other than an edge at which the data driver Ddr is arranged are adjacent to each other. Accordingly, an area of a dead space between the sub-display apparatuses may be significantly reduced.

Figure 10:
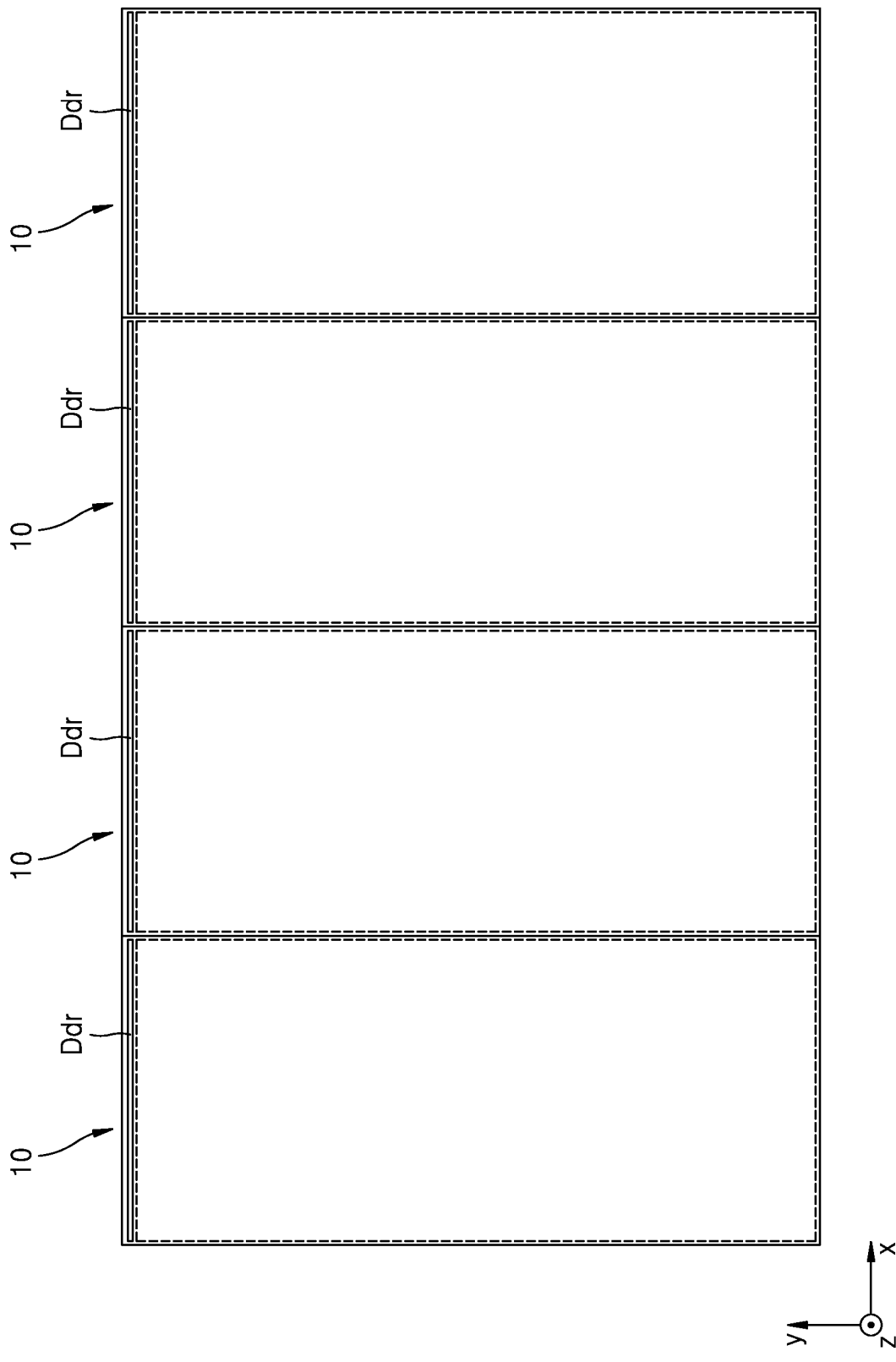
FIG. 10 is a schematic plan view of a display apparatus according to another embodiment.

FIG. 10 is a schematic plan view of a display apparatus according to another embodiment. The display apparatus of FIG. 10 is different from the display apparatus of FIG. 9 in that adjacent sub-display apparatuses are arranged so that long sides are attached to each other. In this case, because an edge of a substrate Sub at which the data driver Ddr is arranged is a short side of the sub-display apparatus, an area of a dead space between the sub-display apparatuses may be significantly reduced.

Although FIGS. 2, 3, 5, and 7 illustrate that the transistors are n-channel metal oxide semiconductor (NMOS) transistors, but the disclosure is not limited thereto. For example, in FIGS. 2, 3, 5, and 7, the transistors may be p-channel metal oxide semiconductor (PMOS) transistors or may include both NMOS and PMOS transistors.

Also, a semiconductor layer included in each of the transistors may include an oxide semiconductor, amorphous silicon, or polysilicon.

According to one or more embodiments having the above-described configuration, a display apparatus in which dead space is significantly reduced may be implemented. The scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a first scan line extending in a first direction;

a second scan line spaced apart from the first scan line and extending in the first direction;

a first pixel set disposed between the first scan line and the second scan line, the first pixel set including a 1-$1^{st}$ pixel including at least two sub-pixels and a 1-$2^{nd}$ pixel including at least two sub-pixels, all sub-pixels included in the 1-$1^{st}$ pixel being electrically connected to the first scan line and all sub-pixels included in the 1-$2^{nd}$ pixel being electrically connected to the second scan line; and at least two first data lines spaced apart from each other, disposed between the 1-$1^{st}$ pixel and the 1-$2^{nd}$ pixel in a plan view, and extending in a second direction crossing the first direction, wherein each of the at least two first data lines is electrically connected to both one of the at least two sub-pixels included in the 1-$1^{st}$ pixel and one of the at least two sub-pixels included in the 1-$2^{nd}$ pixel, and wherein each of the all sub-pixels included in the 1-$1^{st}$ pixel is electrically connected to a corresponding one of the at least two first data lines and each of the all sub-pixels included in the 1-$2^{nd}$ pixel is electrically connected to a corresponding one of the at least two first data lines.

2. The display apparatus of claim 1, wherein the at least two is 3.

3. The display apparatus of claim 1, further comprising:

a second pixel set disposed between the first scan line and the second scan line, the second pixel set including a 2-$1^{st}$ pixel including at least two sub-pixels which are connected to the first scan line and a 2-$2^{nd}$ pixel including at least two sub-pixels which are connected to the second scan line; and at least two second data lines spaced apart from each other, disposed between the 2-$1^{st}$ pixel and the 2-$2^{nd}$ pixel in a plan view, and extending in the second direction, each of the at least two second data lines being electrically connected to both the 2-$1^{st}$ pixel and the 2-$2^{nd}$ pixel.

4. The display apparatus of claim 3, further comprising a shift register distributed in a display area in which the first pixel set and the second pixel set are arranged, the shift register being configured to supply scan signals to the first scan line and the second scan line.

5. The display apparatus of claim 4, wherein the shift register includes a first distributed circuit disposed between the first pixel set and the second pixel set.

6. The display apparatus of claim 4, wherein the shift register includes a first distributed circuit disposed between the first pixel set and the second pixel set, a second distributed circuit disposed on one side of the first distributed circuit with the first pixel set disposed between the first distributed circuit and the second distributed circuit, and a third distributed circuit disposed on the other side of the first distributed circuit with the second pixel set disposed between the first distributed circuit and the third distributed circuit.

7. The display apparatus of claim 6, further comprising a connection wire disposed such that the first scan line is disposed between the connection wire and the first pixel set or the second scan line is disposed between the connection wire and the first pixel set, the connection wire electrically connecting the first to third distributed circuits to each other.

8. The display apparatus of claim 6, wherein the first distributed circuit, the second distributed circuit, and the third distributed circuit each includes one of a controller, an inverter circuit, an output circuit, and a pull-down circuit.

9. The display apparatus of claim 6, wherein the first distributed circuit is a controller, the second distributed circuit is an inverter circuit, and the third distributed circuit is an output circuit and a pull-down circuit.

10. The display apparatus of claim 4, further comprising a substrate having an upper surface on which the first pixel set and the second pixel set are arranged, the upper surface having a first edge, a second edge, a third edge, and a fourth edge, wherein a first distance between the display area and the first edge is greater than a second distance between the display area and the second edge, a third distance between the display area and the third edge, and a fourth distance between the display area and the fourth edge in a plan view.

11. The display apparatus of claim 10, further comprising a data driver disposed between the display area and the first edge.

12. The display apparatus of claim 3, wherein a distance between the 1-$1^{st}$ pixel and the 1-$2^{nd}$ pixel is shorter than a distance between the first pixel set and the second pixel set.

13. The display apparatus of claim 1, wherein the sub-pixels connected to a same data line emit a same color of light.

14. The display apparatus of claim 1, further comprising a substrate having an upper surface on which the first pixel set is arranged, the upper surface having a first edge, a second edge, a third edge, and a fourth edge, wherein a first distance between a display area in which the first pixel set is arranged and the first edge is greater than a second distance between the display area and the second edge, a third distance between the display area and the third edge, and a fourth distance between the display area and the fourth edge in a plan view.

15. The display apparatus of claim 14, further comprising a data driver disposed between the display area and the first edge.

* * * * *